(12) United States Patent
Thei et al.

(10) Patent No.: US 7,985,690 B2
(45) Date of Patent: Jul. 26, 2011

(54) METHOD FOR A GATE LAST PROCESS

(75) Inventors: Kong-Beng Thei, Hsin-Chu Country (TW); Harry Chuang, Hsin-Chu (TW); Su-Chen Lai, Hsinchu (TW); Gary Shen, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 14 days.

(21) Appl. No.: 12/478,358

(22) Filed: Jun. 4, 2009

(65) Prior Publication Data
US 2010/0311231 A1 Dec. 9, 2010

(51) Int. Cl.
*H01L 21/302* (2006.01)
*H01L 21/461* (2006.01)

(52) U.S. Cl. ........ 438/706; 438/510; 438/692; 438/740; 257/E21.006; 257/E21.058; 257/E21.17; 257/E21.126; 257/E21.127; 257/E21.182; 257/E21.245; 257/E21.267; 257/E21.278; 257/E21.293; 257/E21.304; 257/E21.4; 257/E21.421; 257/E21.585

(58) Field of Classification Search ............... 438/197, 438/199, 311, 510, 603, 604, 663, 682, 692, 438/680, 684, 706, 740, 743, 744, 745, 933, 438/769; 257/E21.17, 6, 58, 126, 127, 182, 257/231, 245, 267, 278, 293, 304, 4, 421, 257/585
See application file for complete search history.

(56) References Cited

U.S. PATENT DOCUMENTS

| | | | |
|---|---|---|---|
| 7,326,645 B2 * | 2/2008 | Shim ........................... | 438/634 |
| 7,648,882 B2 * | 1/2010 | Jiang et al. ................... | 438/287 |
| 2002/0119618 A1 * | 8/2002 | Tseng et al. .................. | 438/241 |

* cited by examiner

Primary Examiner — David Nhu
(74) Attorney, Agent, or Firm — Haynes and Boone, LLP (57) ABSTRACT

A method for fabricating a semiconductor device is disclosed. The method includes providing a substrate; forming one or more gate structures over the substrate; forming a buffer layer over the substrate, including over the one or more gate structures; forming an etch stop layer over the buffer layer; forming a interlevel dielectric (ILD) layer over the etch stop layer; and removing a portion of the buffer layer, a portion of the etch stop layer, and a portion of the ILD layer over the one or more gate structures.

21 Claims, 11 Drawing Sheets

METHOD FOR A GATE LAST PROCESS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. In some IC designs, such scaling-down has also lead to a desire to replace a conventional polysilicon gate electrode with a metal gate electrode to improve device performance.

One process for forming a metal gate structure (e.g., having a metal gate electrode) is referred to as a "gate last" process, where the final gate stack is fabricated last. This reduces the number of subsequent processes, including high temperature processing, that must be performed after formation of the gate structures. There are challenges to implementing such features and processes in conventional fabrication however. As the gate length and spacing between devices decreases, these problems are exacerbated. For example, during chemical mechanical polishing (CMP) processes, controlling gate height and/or preventing dishing effects (for example, over-polishing) of an inter-layer dielectric layer may present difficulties. Also, it has been observed that dishing effects can cause failure of overlay and alignment mark patterns.

Accordingly, what is needed is a method for fabricating an IC device that addresses the above stated issues.

SUMMARY

A method for fabricating a semiconductor device is provided. In one embodiment, the method includes providing a substrate having one or more gate structures disposed thereover; forming an etch stop layer and an interlevel dielectric (ILD) layer over the substrate, including over the one or more gate structures, wherein the ILD layer is disposed over the etch stop layer; performing a partial chemical mechanical polishing process on the ILD layer, wherein a thickness of the ILD layer remains over the etch stop layer; and performing a first selective dry etching process on the ILD layer and a second selective dry etching process on the etch stop layer.

In one embodiment, the method for fabricating a semiconductor device, wherein the semiconductor device includes a substrate, includes forming one or more gate structures over the substrate including a high-k dielectric layer, a dummy gate layer, and a hard mask layer; forming an etch stop layer, and an interlevel dielectric (ILD) layer over the one or more gate structures; performing a partial chemical mechanical polishing process on the ILD layer, wherein a thickness of the ILD layer remains over the etch stop layer; performing a first selective dry etching process to selectively remove a portion of the ILD layer over the one or more gate structures; performing a second selective dry etching process to selectively remove a portion of the etch stop layer over the one or more gate structures; and performing a third selective dry etching process to selectively remove the hard mask layer.

In one embodiment, the method for fabricating a semiconductor device includes providing a substrate having at least one gate structure disposed thereover; forming a buffer layer, an etch stop layer, and an interlevel (ILD) layer over the substrate, including over the at least one gate structure; performing a partial chemical mechanical polishing process on the ILD layer; and performing at least two selective dry etching processes to remove the ILD layer, etch stop layer, and buffer layer from over the one or more gates structure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to methods for manufacturing integrated circuit devices, and more particularly, to a method for a gate last process.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
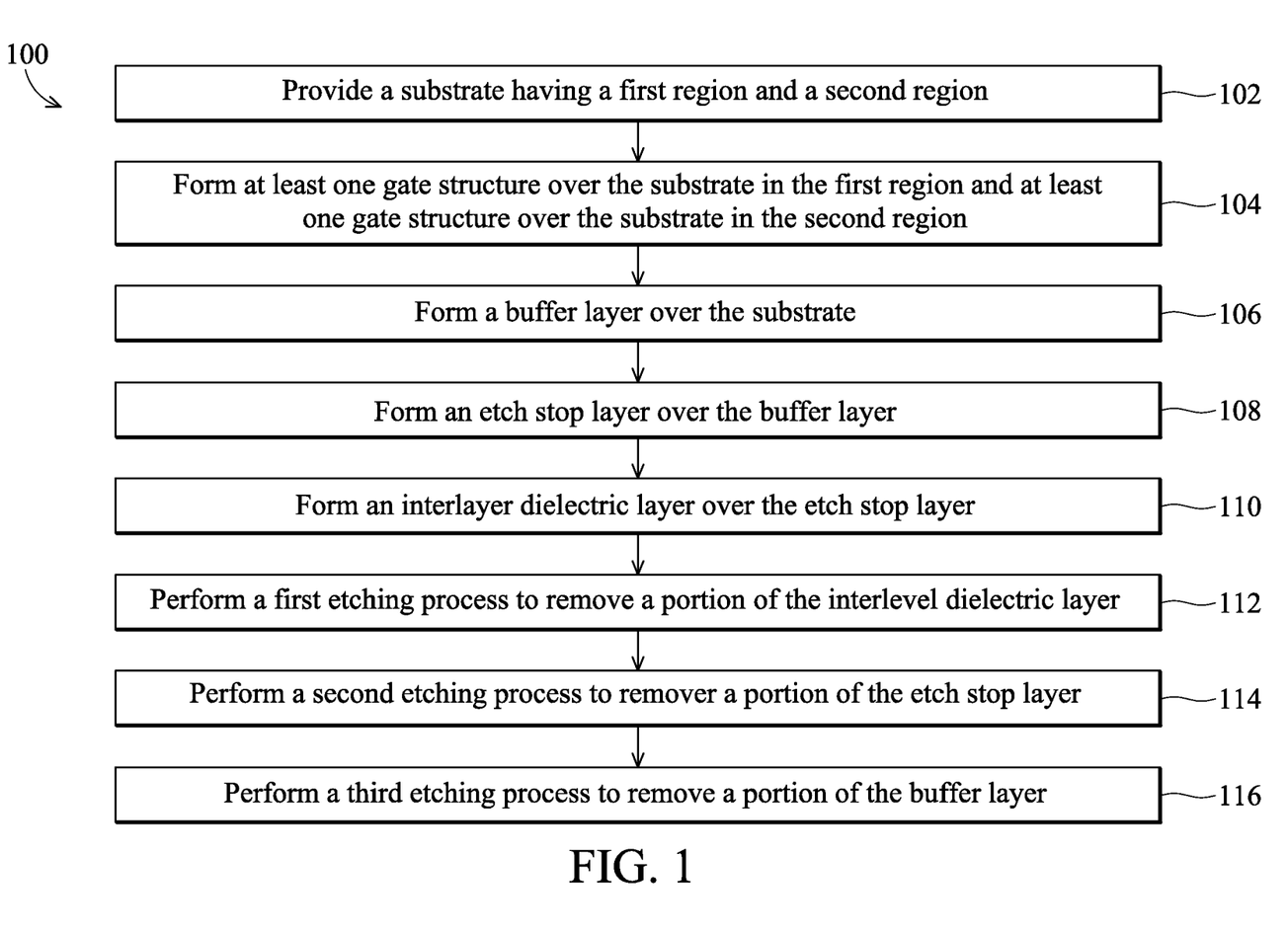
FIG. 1 is a flow chart of a method for fabricating a semiconductor device according to aspects of the present invention.
Figure 2A:
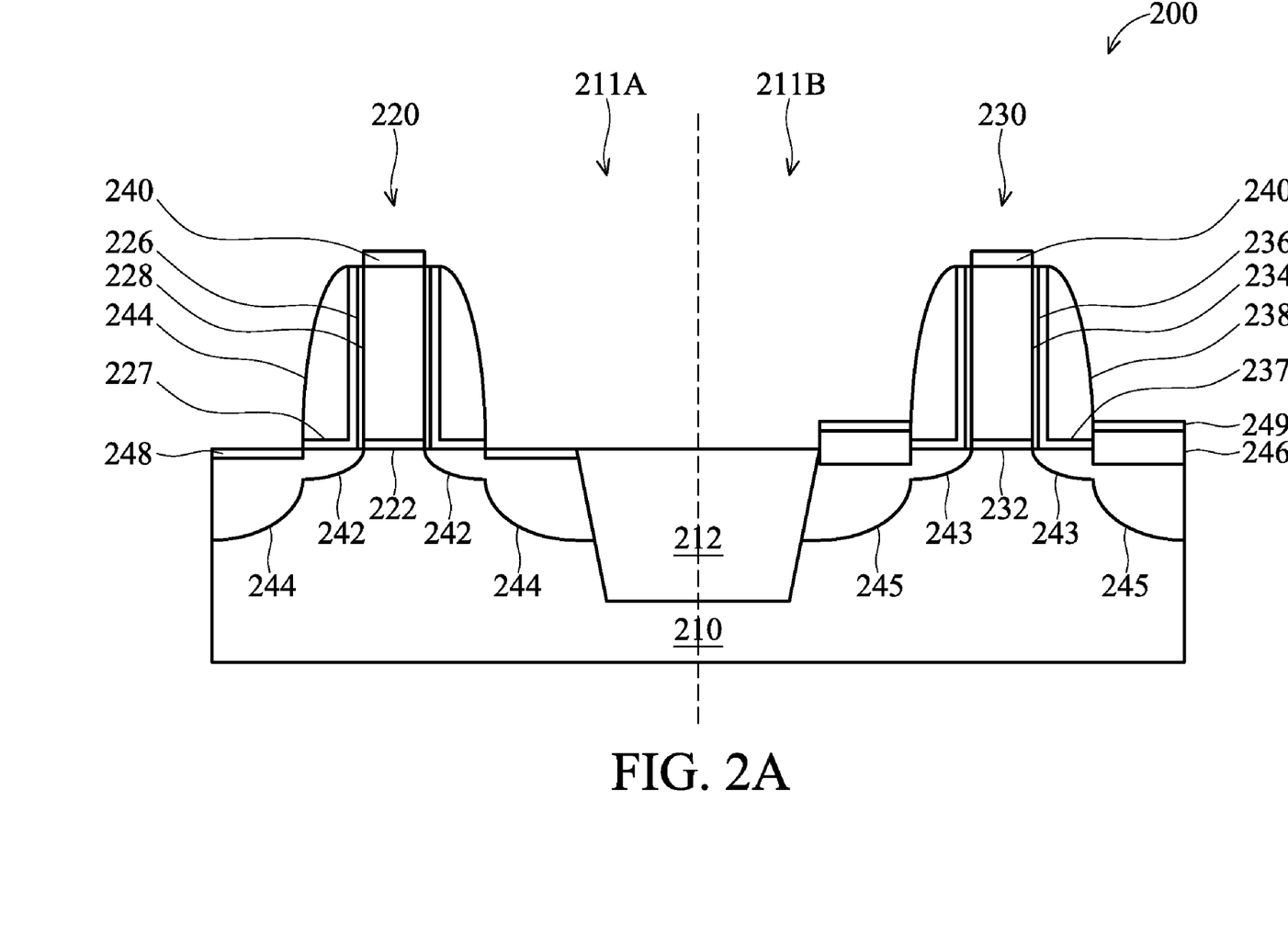
FIGS. 2A-2J are various cross-sectional views of embodiments of a semiconductor device during various fabrication stages according to the method of FIG. 1.
Figure 2B:
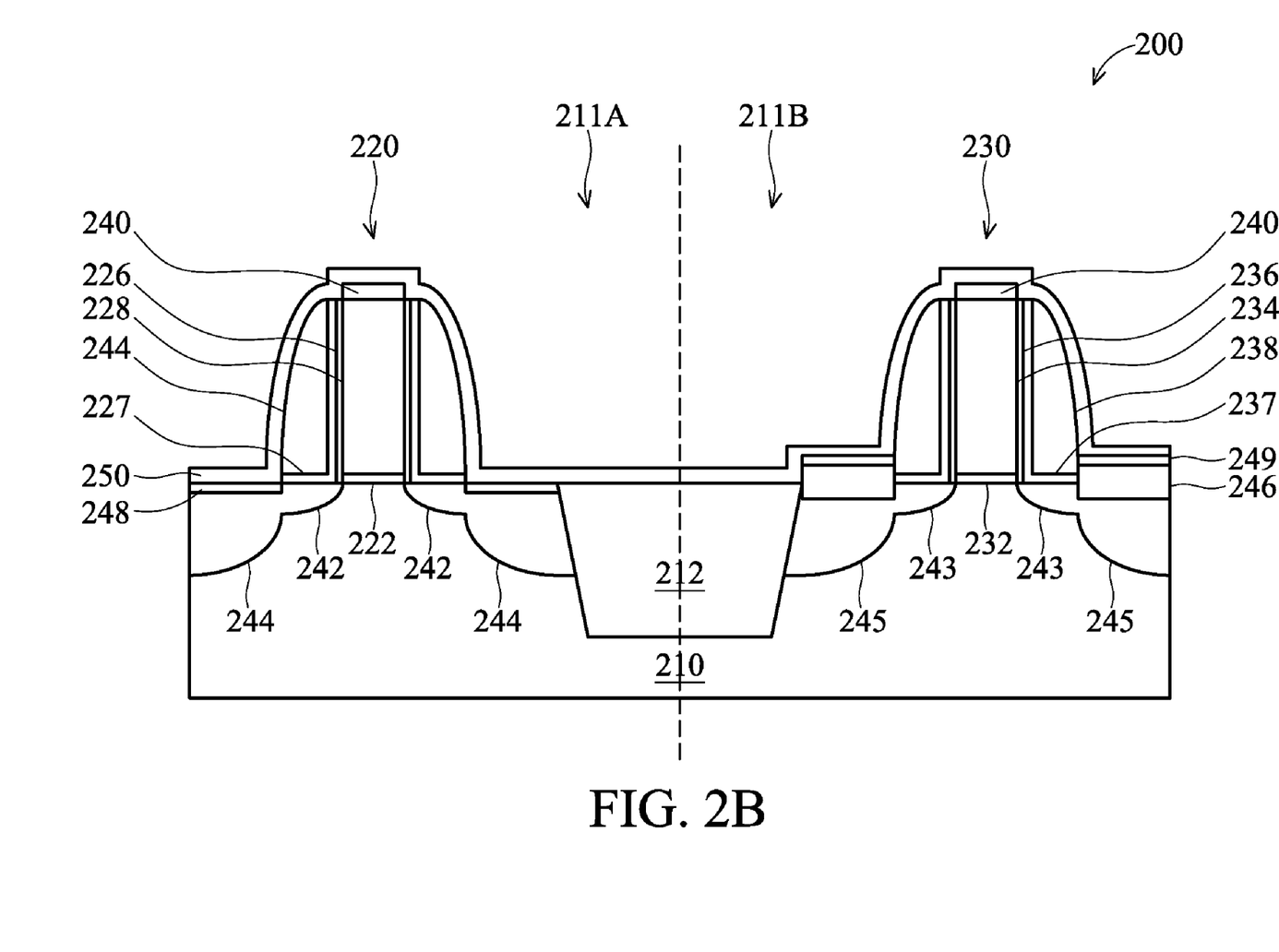
Figure 2C:
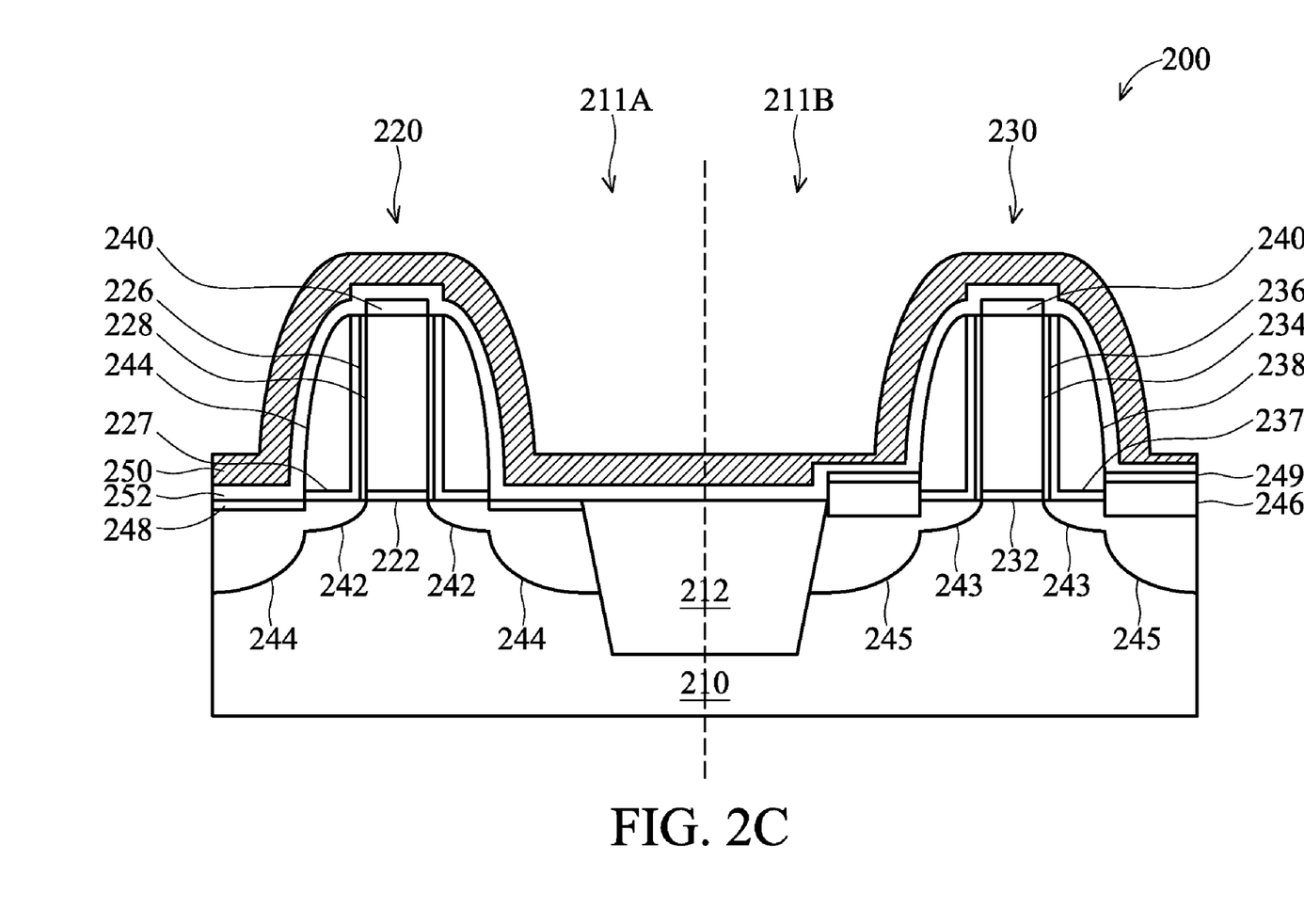
Figure 2D:
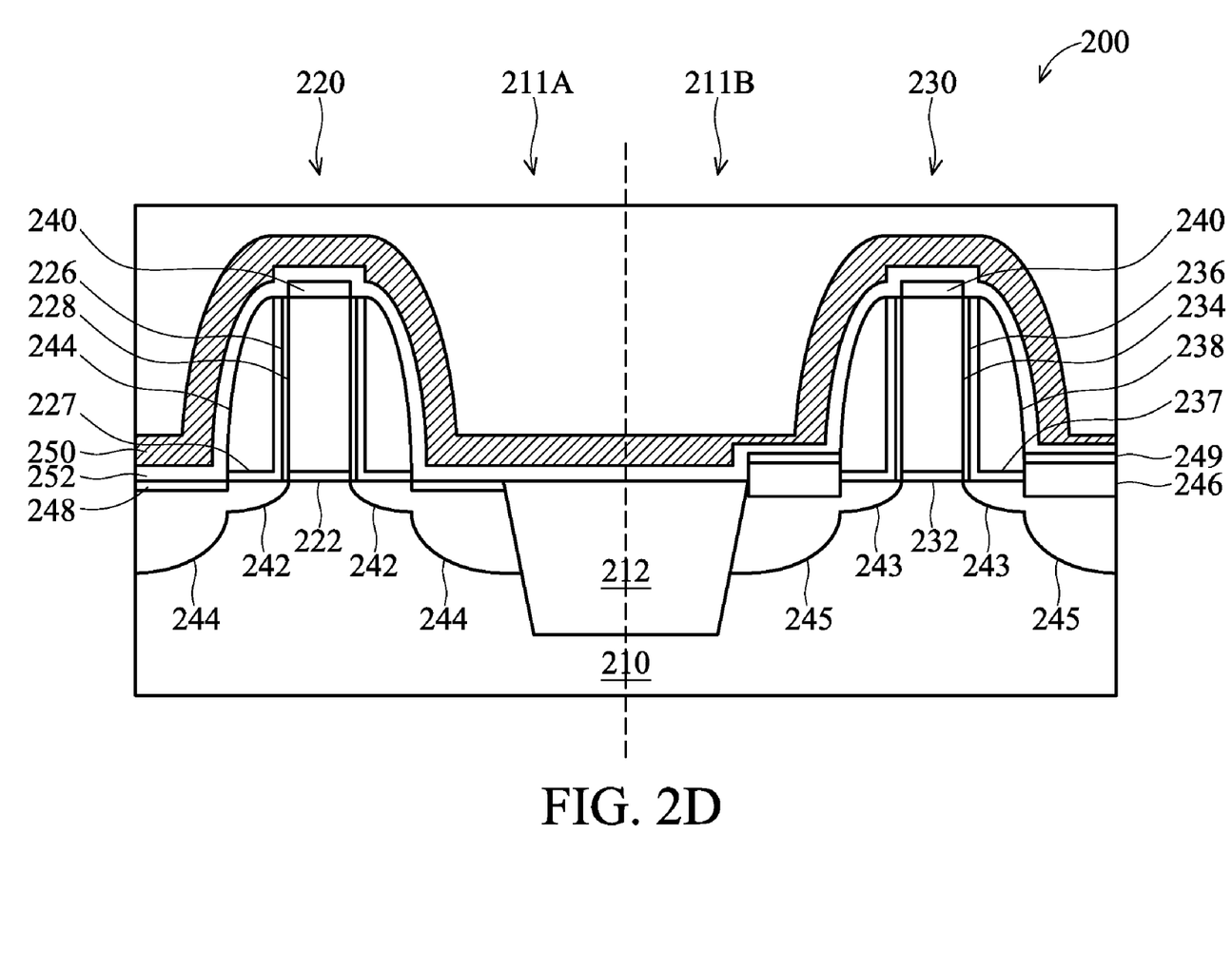
Figure 2E:
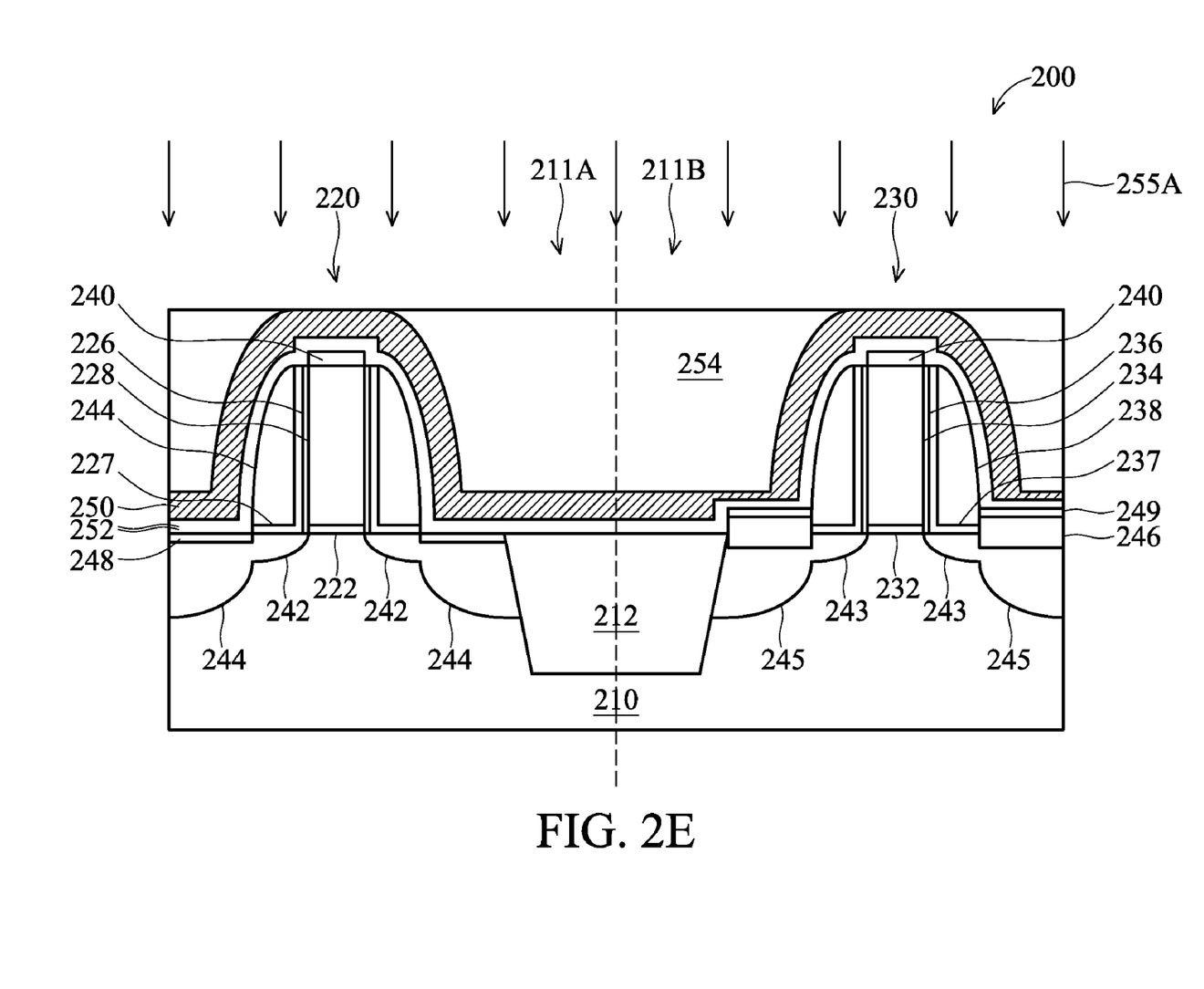
Figure 2F:
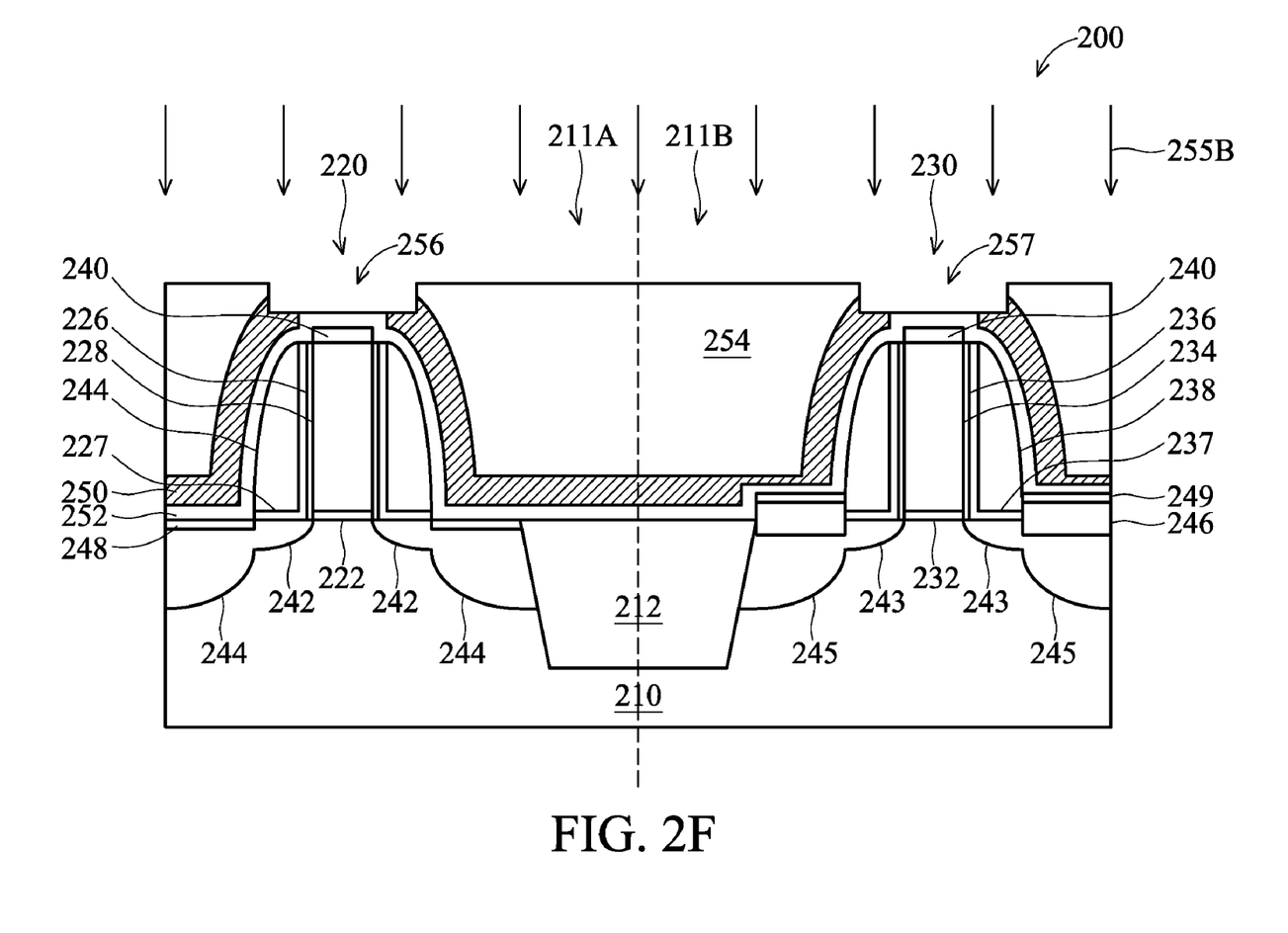
Figure 2G:
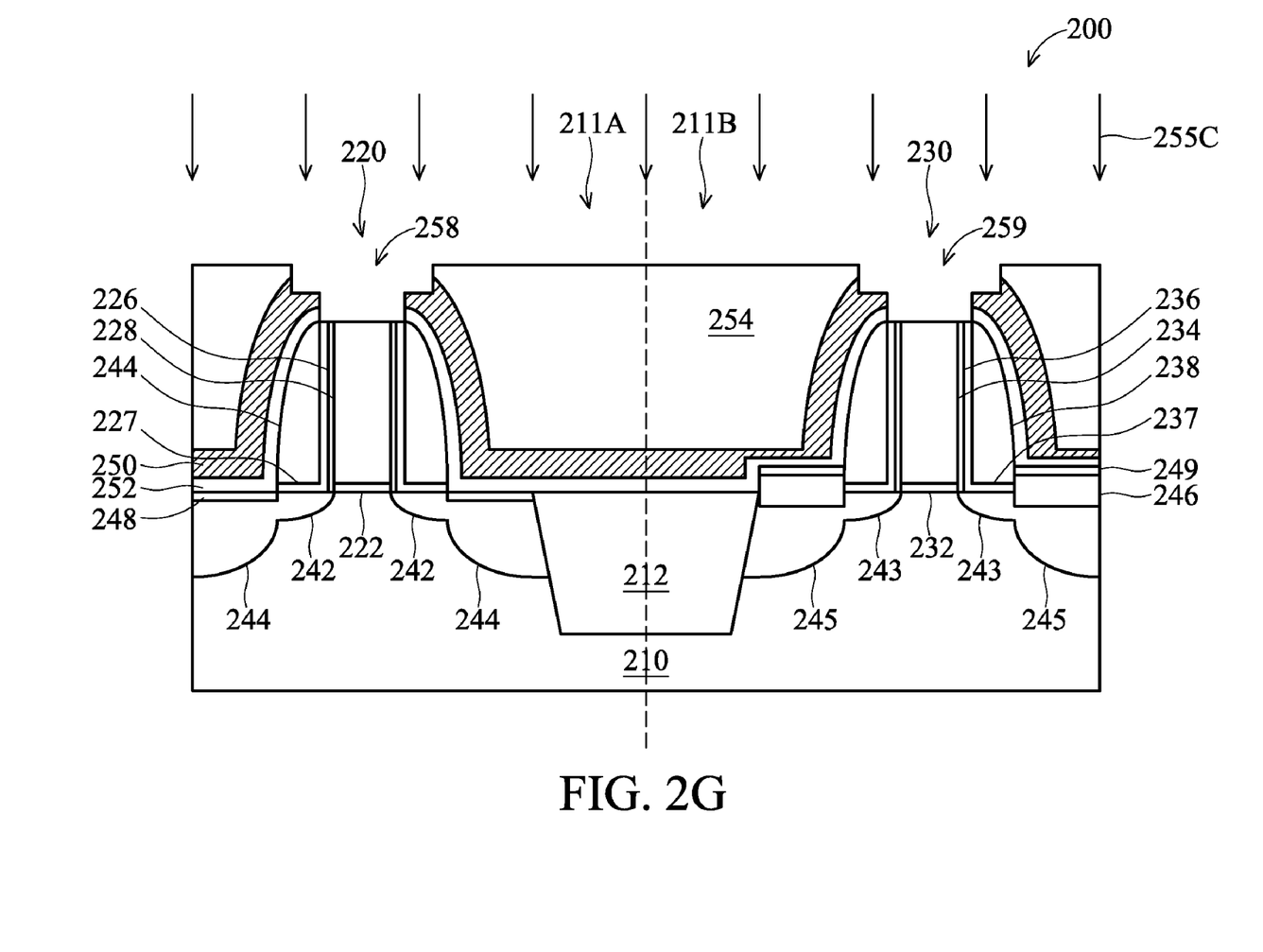
Figure 2H:
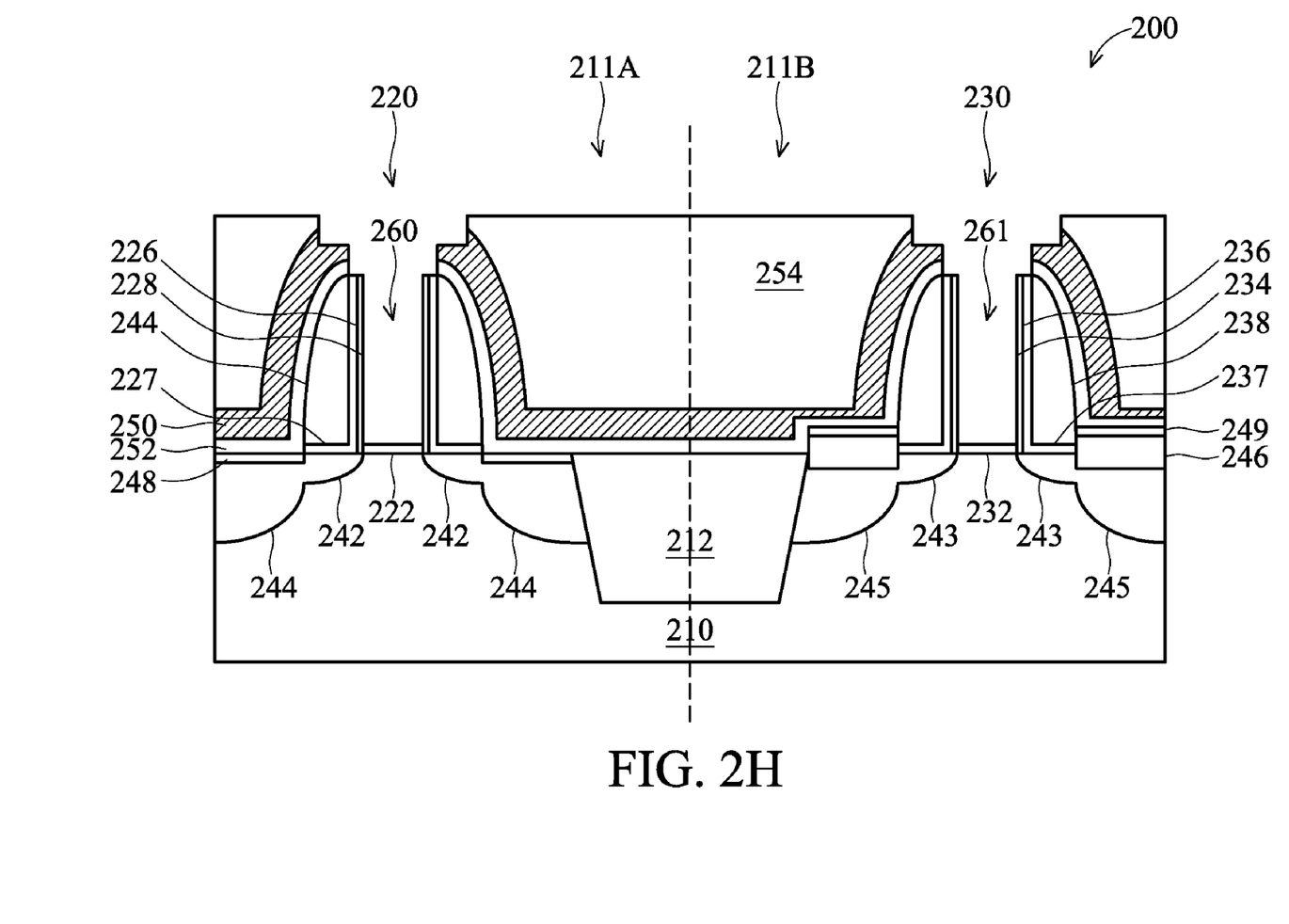
Figure 2I:
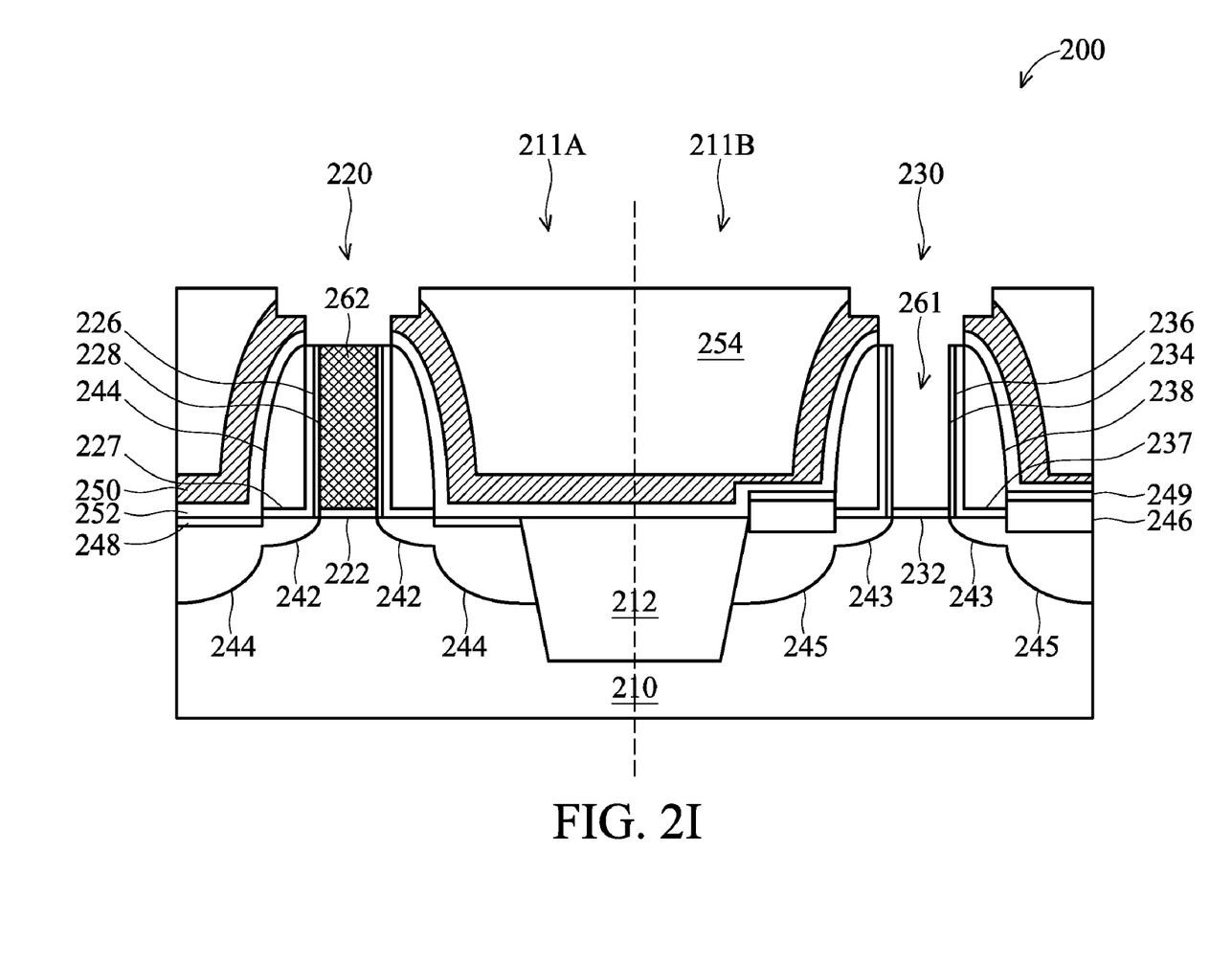
Figure 2J:
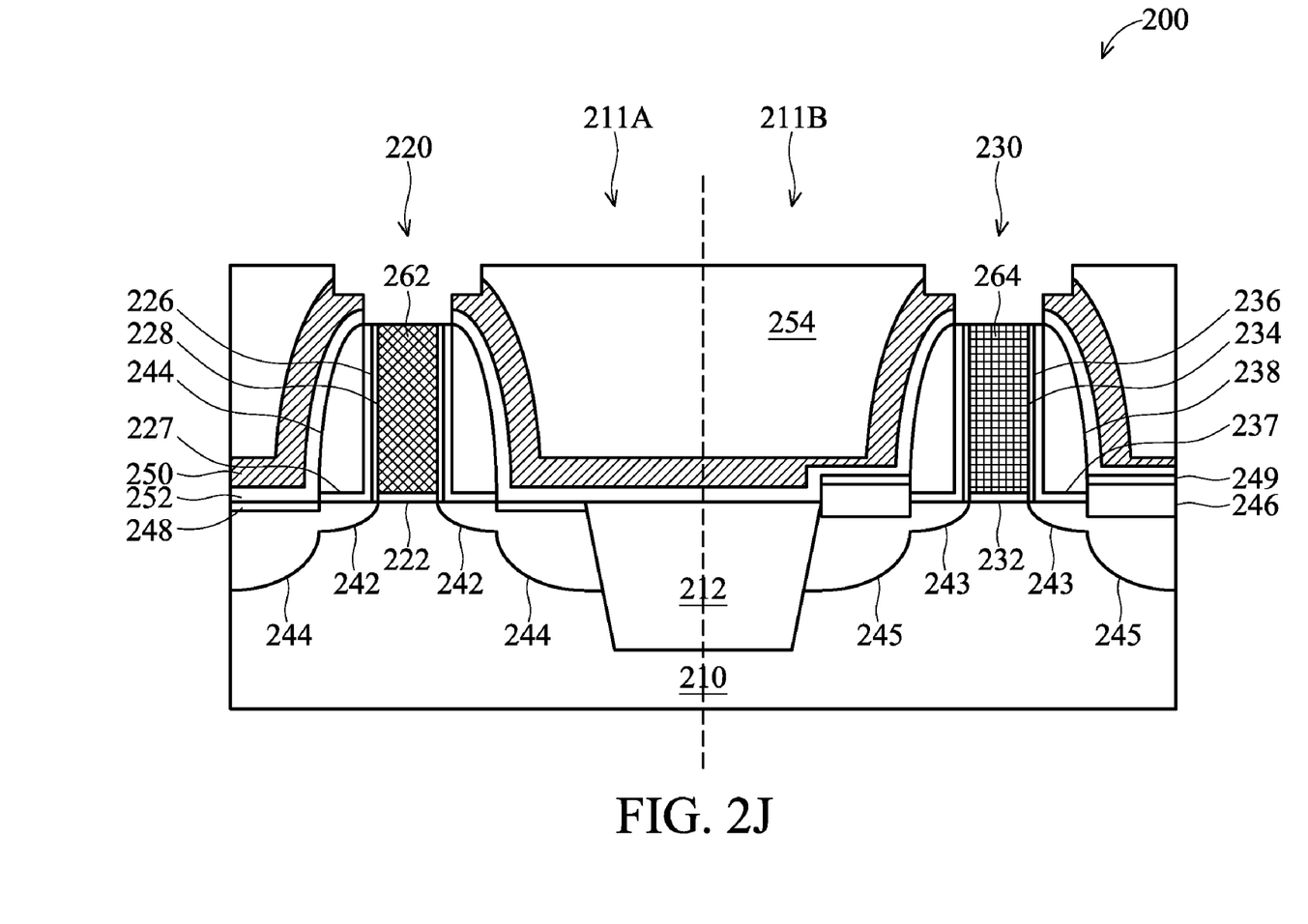

With reference to FIGS. 1 through 2J, a method 100 and a semiconductor device 200 are collectively described below. The semiconductor device 200 may be an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The semiconductor device 200 is fabricated in a gate last process. Alternatively, the semiconductor device 200 may be fabricated in a gate first process or hybrid process including a gate first process and a gate last process. In the gate last process, a dummy poly gate structure is formed first and then the dummy poly gate structure may be removed and replaced with a metal gate structure. In the gate first process, a metal gate structure may be formed first and may be followed by a CMOS process flow to fabricate the final device. In the hybrid gate process, a metal gate structure of one type of device may be formed first and a metal gate structure of another type of device may be formed last. Further, in some embodiments, the gate last, gate first process, or hybrid process may form a gate structure comprising polysilicon.

FIG. 1 is a flow chart of one embodiment of the method 100 for fabricating the semiconductor device 200 in a "gate last" process. FIGS. 2A-2J are various cross-sectional views of the semiconductor device 200 according to one embodiment, in portion or entirety, during various fabrication stages of the method 100. Referring to FIGS. 1 and 2A, the method 100 begins at step 102 wherein a substrate 210 including a first region 211A and a second region 211B is provided. In the present embodiment, the substrate 210 is a semiconductor substrate comprising silicon. The semiconductor substrate 210 may alternatively or additionally include an elementary semiconductor including silicon or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doping regions depending on design requirements as known in the art (e.g., p-type wells or n-type wells). The doped regions may be doped with p-type or n-type dopants. For example, the doped regions may be doped with p-type dopants, such as boron or $BF_2$; n-type dopants, such as phosphorus or arsenic; and/or combinations thereof. Some of the doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). In the present embodiment, the substrate 210 includes first region 211A configured for an NMOS device and second region 211B configured for a PMOS device. It is understood that the semiconductor device 200 may be formed by CMOS technology processing, and thus some processes are not described in detail herein.

One exemplary isolation region 212 is formed on the substrate 210 to isolate various regions (e.g., first and second regions 211A, 211B) of the substrate 210, and in the present embodiment, to isolate the NMOS and PMOS device regions. The isolation region 212 may utilize isolation technology, such as local oxidation of silicon (LOCOS) or shallow trench isolation (STI), to define and electrically isolate the various first and second regions 211A, 211B. In the present embodiment, the isolation region 212 includes a STI. The isolation region 212 may comprise silicon oxide, silicon nitride, silicon oxynitride, other suitable materials, or combinations thereof. The isolation region 212, and in the present embodiment, the STI, may be formed by any suitable process. As one example, the formation of an STI may include a photolithography process, etching a trench in the substrate (for example, by using a dry etching and/or wet etching), and filling the trench (for example, by using a chemical vapor deposition process) with one or more dielectric material. In some embodiments, the filled trench may have a multi-layer structure such as a thermal oxide liner layer filled with silicon nitride or silicon oxide.

Referring to FIG. 2A, at step 104, one or more gate structures are formed over the substrate 210—at least one gate structure is formed over the substrate in the first region 211A and at least one gate structure is formed over the substrate in the second region 211B. In the present embodiment, a first gate structure 220 is formed within the first/NMOS region 211A, and a second gate structure 230 is formed within the second/PMOS region 211B. The gate structures 220, 230 include gate stacks having high-k dielectric layer 222, 232 and dummy gate layer 228, 234. It is understood that a plurality of gate structures may be formed over the substrate 210 in the first and second regions 211A, 211B. The gate structures 220, 230 may be formed by any suitable process. For example, the gate structures may be formed by a procedure including deposition, photolithography patterning and etching processes. The deposition processes may include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, and ion-beam writing. The etching processes may include dry etching, wet etching, and/or other etching methods (e.g., reactive ion etching). The etching process may also be either purely chemical (wet etching), purely physical (ion milling), and/or combinations thereof. It is understood that the gate structures may be formed simultaneously, utilizing the same processing steps and processing materials; independently of one another, utilizing varying processing steps and processing materials; or using a combination of simultaneous and independent processing steps and processing materials.

In the present embodiment, the gate structures 220, 230 comprise gate stacks comprising the high-k dielectric layers 222, 232 and dummy gate layers 228, 234. The gate stack may be formed by any suitable process, including the processes described herein. In one example, a high-k dielectric layer and a dummy gate layer are deposited over the substrate 210. Then, a layer of photoresist is formed over the dummy gate layer by a suitable process, such as spin-on coating, and patterned to form a patterned photoresist feature. The pattern of the photoresist can then be transferred by a dry etching process to the underlying layers (i.e., the high-k dielectric layer and the dummy gate layer) to form the gate stacks comprising high-k dielectric layers 222, 232 and dummy gate layers 228, 234 as shown in FIG. 2A. The photoresist layer may be stripped thereafter. In another example, a hard mask layer is formed over the dummy gate layer; a patterned photoresist layer is formed on the hard mask layer; the pattern of the photoresist layer is transferred to the hard mask layer and then transferred to the dummy gate layer and the high-k dielectric layer to form the gate stack of the gate structures 220, 230. It is understood that the above examples do not limit the processing steps that may be utilized to form the gate stack. It is further understood that the gate stack of the gate structures 220, 230 may comprise additional layers. For example, the gate structures 220, 230 may comprise interfacial layers, capping layers, diffusion/barrier layers, conductive layers, other suitable layers, and/or combinations thereof. Also, the semiconductor device 200 may include one or more antireflective coating layers (e.g., a top antireflective coating layer and/or a bottom antireflective coating layer).

The high-k dielectric layers 222, 232 are formed over the substrate 210. The high-k dielectric layers 222, 232 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The high-k dielectric layers 222, 232 are formed by any suitable process to any suitable thickness, including the processes described herein.

The dummy gate layers 228, 234 may comprise multiple material layers. The dummy gate layers 228, 234 comprise a material with a high etching selectivity compared to the high-k dielectric layers 222, 232, such that the dummy gate layers 228, 234 may be removed without affecting high-k dielectric layers 222, 232. In the present embodiment, the dummy gate layers 228, 234 comprise polysilicon. In some embodiments, the dummy gate layers 228, 234 may comprise a layer of silicon dioxide and a layer of high-k dielectric material. Further, the dummy gate layers 228, 234 may be doped polycrystalline silicon with the same or different doping. The dummy gate layers 228, 234 is formed by any suitable process to any suitable thickness.

A sealing layers 226, 236 may be formed on the sidewalls of the gate stacks of the gate structures 220, 230. In the present embodiment, the sealing layers 226, 236 are formed on the sidewalls of the high-k dielectric layers 222, 232 and dummy gate layers 228, 234. The sealing layer 226, 236 may include a dielectric material, such as silicon nitride, silicon oxide, silicon oxynitride, silicon carbide, other suitable material, and/or combinations thereof. The sealing layer 226, 236 may include a single layer or multiple layer configuration. It should be noted that the sealing layer 226, 236 may protect the gate stacks of the gate structures 220, 230 from damage or loss during subsequent processing, and may also prevent oxidation during subsequent processing. The sealing layer 226, 236 is formed by any suitable process to any suitable thickness.

Spacers may be further formed on the sidewalls of the gate stacks or the sealing layers. In one embodiment, spacer liner 227, 237 and gate spacers 241, 238 may be formed. The spacer liner 227, 237 and gate spacers 241, 238 are formed by any suitable process to any suitable thickness. In the present embodiment, the spacer liner 227, 237 comprise an oxide material (e.g., silicon oxide), and the gate spacers 241, 238, which are positioned on each side of the gate structures 220, 230, comprise a nitride material (e.g., silicon nitride). In various embodiments, the gate spacers 241, 238 may comprise a dielectric material such as silicon nitride, silicon oxide, silicon carbide, silicon oxynitride, other suitable materials, and/or combinations thereof. The gate spacers 241, 238 may be used to offset subsequently formed doped regions, such as heavily doped source/drain regions.

The gate stacks of gate structures 220, 230 further comprise a hard mask layer 240. The hard mask layer 240 is disposed over the dummy gate layer 228, 234. In the present embodiment, the hard mask layer 240 comprises an oxide material, such as silicon oxide. The hard mask layer 240 may comprise a nitrogen-containing material, such as silicon nitride, silicon oxynitride, other suitable nitrogen-containing materials, and/or combinations thereof. The hard mask layer may include an amorphous carbon material, silicon carbide, other suitable dielectric materials, and/or combinations thereof. The hard mask layer 240 is formed by any suitable process to any suitable thickness, including the processes described herein. In one example, as discussed above, the hard mask layer 240 may be formed integrally with the gate stacks of the gate structures 220, 230. The hard mask layer 240 may include a single layer or multiple layers.

Various doped regions may also be formed in the substrate 210. In the present embodiment, various doped regions comprises lightly doped source/drain (LDD) regions 242, 243 and source/drain (S/D) regions 244, 245 (also referred to as heavily doped S/D regions). The LDD regions 242, 243 and S/D regions 244, 245 may be formed by one or more ion implantation processes, photolithography, diffusion, and/or other suitable processes. The doping species may depend on the type of device being fabricated, such as an NMOS or PMOS device. For example, the LDD regions 242, 243 and S/D regions 244, 245 may be doped with p-type dopants, such as boron or $BF_2$; n-type dopants, such as phosphorus or arsenic; and/or combinations thereof. The LDD regions 242, 243 and S/D regions 244, 245 may comprise various doping profiles. It is understood that the LDD regions may be formed prior to formation of the gate spacers 241, 238, and the LDD regions may be aligned with an outer edge of the sealing layers 226, 236 following one or more implantation processes. As previously noted, the sealing layer 226, 236 may provide protection to prevent contamination or damage to the gate stack comprising the high-k dielectric layer 222, 232 and dummy gate layer 228, 234 during subsequent processing. Thus, the integrity of the gate structures 220, 230 may be maintained which may result in better device performance and reliability. Additionally, one or more annealing processes may be performed to activate the LDD regions 242, 243 and/or S/D regions 244, 245. The annealing processes may comprise rapid thermal annealing (RTA) and/or laser annealing processes. It should be noted that during a subsequent annealing process (e.g., activation process) the dopants in the LDD regions 242, 243 may diffuse towards the sidewalls of the gate stack comprising the high-k dielectric layer 222, 232 and dummy gate layer 228, 234 such that a portion of each of the LDD regions 242, 243 may extend underneath a portion of the sealing layer 226, 236. The S/D regions 244, 245 may be aligned with an outer edge of the spacers 241, 238 following the one or more implantation processes.

The doped regions may be formed directly in the semiconductor substrate, in a P-well structure, in a N-well structure, in a dual-well structure, or using a raised structure. In the present embodiment, the S/D regions 245 in the second/PMOS region 211B further comprise raised S/D regions 246. The raised S/D regions 246 may have SiGe features. For example, the raised S/D regions 246 may be formed by one or more epitaxy processes, such that the SiGe features can be formed in a crystalline state in the substrate 210. The epitaxy processes may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which may interact with the composition of the substrate 210 (e.g., silicon). Thus, a strained channel may be achieved in the second/PMOS region 211B to increase carrier mobility and enhance device performance.

One or more contact features 248, 249, such as silicide regions, may also be formed. The contact features 248, 249 may be coupled to the S/D regions 244, 245 and/or raised S/D regions 246. The contact features 248, 249 comprise silicide materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features 248, 249 are formed by any suitable process, including the processes described herein. In the present embodiment, the contact features 248, 249 may be formed by a salicide (self-aligned silicide) process. For example, a metal material may be deposited over the substrate, including over the substrate (e.g., silicon regions) and/or doped regions. After deposition, the salicidation process may continue with a reaction between the deposited metal material and the silicon regions at an elevated temperature that is selected based on the specific metal material or materials. This is also referred to as annealing, which may be a RTP. The unreacted metal material is removed thereafter. The reacted silicide may require additional thermal process to reduce the resistance of the silicide. In the present embodiment, the hard mask layer 240 may protect the dummy gate layer 228, 234 from the salicide process. It should be noted that following the salicide process, the hard mask layer 240 over dummy gate layer 228, 234 may not be removed to provide for improved gate height control in a "gate last" process as will be further discussed below.

Conventional processing would continue with forming one or more dielectric layers over the semiconductor device 200 to fill gaps between gate structures 220, 230, performing a chemical mechanical polishing process until a top portion of the gate structures 220, 230 is reached, and then, performing a gate replacement process. It has been observed that conventional processing presents challenges. For example, in a "gate last" fabrication processes, during the chemical mechanical polishing processes, controlling gate height and/or preventing dishing effects (for example, over-polishing) of the ILD layer may present difficulties. In another example, mark and alignment pattern issues arise. These issues can adversely affect subsequent processing and can also lead to poor device performance. Accordingly, the present embodiment provides a novel method to address such issues.

Referring to FIGS. 1 and 2B, at step 106, a buffer layer 250 may be formed over the semiconductor device 200, including over the gates structures 220, 230, by any suitable process, including the processes described herein. The buffer layer 250 comprises any suitable material and thickness. In the present embodiment, the buffer layer 250 comprises a buffer oxide layer (e.g., PECVD oxide, low pressure chemical vapor deposition (LPCVD) oxide, tetraethyl orthosilicate (TEOS) oxide, etc.). The buffer layer 250 comprises a dielectric material, such as silicon oxide, silicon nitride, silicon oxynitride, other suitable materials, and/or combinations thereof. The buffer layer 250 comprises a thickness greater than about 10 Å. In some embodiments, the thickness ranges between about 10 Å and about 1,000 Å. The buffer layer 250 overlies both the first/NMOS region 211A and the second/PMOS region 211B.

Referring to FIGS. 1 and 2C, at step 108, an etch stop layer (ESL) 252 is formed over the semiconductor device 200, including over the gate structures 220, 230, by any suitable process, including the processes described herein. In the present embodiment, ESL 252 may be deposited over the buffer layer 250. The ESL 252 may comprise silicon nitride, silicon oxynitride, other suitable materials, and/or combinations thereof. Further, the composition of ESL 252 may be selected based upon etching selectivity to one or more additional features of the semiconductor device 200. In some embodiments, the ESL 252 may be configured as a tensile-ESL or a compressive-ESL depending on transistor type (e.g., NFET and/or PFET). In the present embodiment, ESL 252 is a contact etch stop layer (CESL) comprising silicon nitride. The ESL 252 comprises a first profile and may comprise any suitable thickness. For example, ESL 252 may comprise a thickness ranging between about 100 Å and 1,000 Å.

At step 110, an interlevel (or interlayer) dielectric (ILD) layer 254 is formed over the semiconductor device 200, including over the at least one gate structures by any suitable process, including the processes described herein. More specifically, the ILD layer 254 is formed over ESL 252, including over the gate structures 220, 230. In the present embodiment, the ILD layer 254 is deposited by a high density plasma chemical vapor deposition (HDP-CVD) process. Alternatively, the ILD layer may be formed by Applied Materials, Inc. HARP™ (high aspect ratio process) system. The ILD layer 254 may comprise a dielectric material, such as silicon oxide, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, porous polymeric materials, nonporous polymeric materials, other suitable dielectric materials, and/or combinations thereof. It is understood that the ILD layer 254 may comprise one or more dielectric materials and/or one or more dielectric layers. Subsequently, a chemical mechanical polishing (CMP) process may be performed on the ILD layer. In the present embodiment, the ILD layer 254 is planarized by a partial CMP process, wherein a portion of the ILD layer 254 remains over the ESL 252 over the gate structures 220, 230 as shown in FIG. 2D. For example, the partial CMP process may provide a substantially planarized ILD layer 254 surface, wherein a thickness of the ILD layer 254 disposed over the ESL 252 and gate structures 220, 230 ranges between about 300 Å and about 500 Å. In some embodiments, the thickness of the ILD layer 254 over the ESL 252 is about 200 Å. The CMP process may also have low dishing and/or metal erosion effect.

Referring to FIGS. 1 and 2E, at step 112, a first etching process 255A is performed on the semiconductor device 200 to remove a portion of the ILD layer 254. In the present embodiment, the first etching process 255A is performed on the ILD layer 254 remaining over ESL 252 and gate structures 220, 230 until ESL 252 is exposed and/or reached. The first etching process comprises an etch back process. In the present embodiment, the remaining portion and/or thickness of the ILD layer 254 overlying the ESL 252 and gate structures 220, 230 is removed by the first etching process. The first etching process may provide a substantially planar surface for the semiconductor device 200. The first etching process may comprise one or more dry etching processes. For example, a dry etching process may implement a fluorine-containing gas (e.g., $CF_4$, $SF_6$, $CH_2F_2$, $CHF_3$, and/or $C_2F_6$), other suitable gases and/or plasmas and/or combinations thereof. In one embodiment, the first etching process 255A is a selective dry etching process, having a high etching selectivity between the ILD layer 254 and ESL 252. In the present embodiment, with the ILD layer 254 comprising oxide and the ESL 252 comprising silicon nitride, the first etching process 255A is tuned to exhibit a high etching selectivity between silicon nitride and oxide, such that the first etching process 255A removes ILD 254 until it reaches ESL 252. For example, the first etching process 255A may comprise an oxide etching process. The oxide etching process may comprise utilizing an etching gas comprising $C_4F$, Ar, and Co.

It is understood that the first etching process 255A may include multiple etching steps and etching chemicals. The wet etching process may be alternatively or additionally implemented, utilizing a hydrofluoric acid (HF) solution. In one example, the HF solution may have any suitable concentration (e.g., 1:100). In some embodiments, a wet etching process may apply a diluted hydrofluoric acid (HF) to the semiconductor device 200.

At step 114, a second etching process 255B is performed on the semiconductor device 200 to remove a portion of the etch stop layer. In the present embodiment, the second etching process 255B is performed on the ESL 252 until the buffer layer 250 over the gate structures 220, 230 is reached and/or exposed as illustrated in FIG. 2F. The removed portions of ESL 252 form first openings (or trenches) 256, 257 over the gate structures 220, 230. In the present embodiment, the second etching process 255B comprises a dry etching process, which may be implemented in an etching chamber using process parameters, including a radio frequency (RF) source power, a bias power, a pressure, a flow rate, a wafer temperature, and other suitable process parameters, tuned to have a high etching selectivity. The dry etching process may implement an oxygen-containing gas, fluorine-containing gas (e.g., $CF_4$, $SF_6$, $CH_2F_2$, $CHF_3$, and/or $C_2F_6$), oxygen-containing gas, other suitable gases and/or plasmas, and/or combinations thereof. Further, the dry etching process may be performed for any suitable time.

In one embodiment, the second etching process 255B is a selective dry etching process, having a high etching selectivity between the ESL 252 and buffer layer 250. Accordingly, the buffer layer 250 may function as an etch stop layer. If the buffer layer does not present, the second etching process 255B is a selective dry etching process, having a high etching selectivity between the ESL 252 and hard mask layer 240. In the present embodiment, with the ESL 252 comprising silicon nitride and the buffer layer 250 and ILD layer 254 comprising oxide, the second etching process 255B is tuned to exhibit a high etching selectivity between silicon nitride and oxide, such that the second etching process 255B removes ESL 252 without substantially affecting the buffer layer 250 and/or ILD layer 254. For example, the second etching process 255B may comprise a nitride etching process. The nitride etching process may comprise utilizing an etching gas comprising Ar and $CF_4$. The high etching selectivity for silicon nitride to oxide essentially provides self-aligned first openings 256, 257 over the gate structures 220, 230. It is understood that the second etching process 255B may include multiple etching steps and etching chemicals.

At step 116, a third etching process 255C is performed on the semiconductor device 200 to remove a portion of the buffer layer. In the present embodiment, the third etching process 255C is performed on the buffer layer 250 until a top portion of the gate structures 220, 230 is reached and/or exposed as illustrated in FIG. 2G. The removed portions of buffer layer 250 form second openings and/or trenches 258, 259 over the gate structures 220, 230. In the present embodiment, the third etching process 255C comprises a dry etching process, which may be implemented in an etching chamber using process parameters, including a radio frequency (RF) source power, a bias power, a pressure, a flow rate, a wafer temperature, and other suitable process parameters, tuned to have a high etching selectivity. The dry etching process may implement a fluorine-containing gas (e.g., $CF_4$, $SF_6$, $CH_2F_2$, $CHF_3$, and/or $C_2F_6$), other suitable gases and/or plasmas, and/or combinations thereof. Further, the dry etching process may be performed for any suitable time.

The third etching process 255C is a selective dry etching process, having a high selectivity between the buffer layer 250 and dummy gate layer 224, 234 of gate structures 220, 230, and/or ESL 252. Accordingly, the dummy gate layer 224, 234 may function as an etch stop layer. The third etching process 255C may be substantially similar to the first etching process 255A. In the present embodiment, with the buffer layer 250 comprising oxide and the dummy gate layer 224, 234 of gate structures 220, 230 comprising polysilicon, the third etching process 255C additionally exhibits a high etching selectivity between oxide and polysilicon, such that the third etching process 255C removes the buffer layer 250 without affecting the dummy gate layer 224, 234 of gate structures 220, 230. For example, the third etching process 255C may comprise an oxide etching process. As previously noted, the hard mask layer 240 was not removed prior to the ILD gap fill, and thus, the third etching process 255C may simultaneously remove the hard mask layer 240, with the third etching process 255C having a high etching selectivity between oxide and polysilicon/silicon nitride. In some embodiments, the hard mask layer 240 may be removed by a separate process. The high etching selectivity for oxide to polysilicon essentially provides second self-aligned openings 258, 259 over the gate structures 220, 230. Due to the third etching process 255C having a high etching selectivity, ESL 252 may remain unaffected. It is understood that the third etching process 255C may include multiple etching steps and etching chemicals.

Referring to FIGS. 2H-2J, in a gate last process, a gate replacement process may be performed. More particularly, referring to FIG. 2H, a portion of the gate structures 220, 230 is removed, thereby forming third openings (or trenches) 260, 261 in the gate structures 220, 230. In the present embodiment, the dummy gate layer 228, 234 of gate structures 220, 230 is removed. Removing the portions of the gate structures 220, 230 may be accomplished by any suitable etching process. In the gate replacement process, removing dummy gate layer 228, 234 may include an etching process to etch away the dummy gate layer 228, 234. In another example, the dummy gate layer 228, 234 may be selectively etched away. The etching process may comprise one or more dry etching processes, wet etching processes, and/or combinations thereof.

Then, metal material may be formed within the third openings 260, 261, resulting gate layers 262 and 264. The process to form the metal material may implement any suitable process, such as PVD, CVD, plating, and combinations thereof. Then a CMP process may be further applied to remove the excessive metal material and planarize the surface.

It is understood that dummy gate layer 228 and dummy gate layer 234 may be removed from gate structures 220, 230 simultaneously or independently. In one embodiment, the gate replacement process is separately implemented to the first gate structure 220 in the NMOS region 211A and the second gate structure 230 in the PMOS region 211B, such that the first gate layer 262 has a first work function and the second gate layer 264 has a second work function different from the first work function. The first work function is tuned for optimized performance of the NMOS transistor. The second work function is tuned for optimized performance of the PMOS transistor. In furtherance of the embodiment, the first work function for the NMOS transistor is about 4.2 eV or less. The second work function for the PMOS transistor is about 5.2 eV or more. In this case, the gate replacement process is independently applied to the NMOS region 211A and the PMOS region 211B.

In one embodiment, the removing dummy gate layer 228 and 234 may be implemented simultaneously and the openings 260 and 261 are filled in separately. In this case, the removing dummy gate may include forming a photoresist layer over the semiconductor device 200; patterning the photoresist layer by a conventional photolithography process to expose the dummy gate layer 224; and etching away the dummy gate layer 228. Subsequently, the photoresist layer may be removed. Then, metal gate structures may be formed within the third openings 260. Similarly, the removing dummy gate layer 234 may include forming a photoresist layer over the semiconductor device 200; patterning the photoresist layer by a conventional photolithography process to expose the dummy gate layer 234; and etching away the dummy gate layer 234. Subsequently, the photoresist layer may be removed. Then, metal gate structures may be formed within the third openings 261.

In another embodiment, the removing dummy gate layer 241 and filling the opening 260 are implemented in a procedure and the removing dummy gate layer 234 and filling the opening 261 are implemented in another procedure.

For example, referring to FIG. 2I and FIG. 2J, in the present embodiment, a first gate layer 262 is formed in the opening 260 of the gate structure 220 in the first/NMOS device region 211A, and a second gate layer 264 is formed in the opening 261 of the gate structure 230 in the second/PMOS device region 211B. The first and second gate layers 262, 264 may be formed using CVD, PVD, ALD, plating, other suitable processes, and/or combinations thereof. The first and second gate layers 262, 264 each may comprise a work function metal layer and an additional conductive layer, such as aluminum or tungsten. The work function metal layer for the NMOS transistor may include tantalum, titanium aluminum, titanium aluminum nitride, or combination thereof. The work function metal layer for the PMOS transistor may include titanium nitride, tantalum nitride, or combinations thereof. In another embodiment, the first and second gate layers may include any suitable material, such as aluminum, copper, tungsten, titanium, tantulum, titanium nitride, tantalum nitride, nickel silicide, cobalt silicide, silver, TaC, TaSiN, TaCN, TiAl, TiAlN, WN, metal alloys, other suitable materials, and/or combinations thereof. In the present embodiment, the first gate layer 262 includes a n-type work function material, such as TiAl, TiAlN, and/or TaCN, and the second gate layer 264 includes a p-type work function material, such as TiN, WN, and/or W. Thus, the first gate layer 262 including the n-type work function material provides a gate electrode that properly performs in the first/NMOS device region 211A, and the second gate layer 264 including the p-type work function material provides a gate electrode that properly performs in the second/PMOS device region 211B. The n-metal and p-metal structures may be formed in any order. Further, during the formation of the metal gate structures for the first/NMOS device region 211A and the second/PMOS device region 211B, N/P patterning may be implemented to separate one type of device from the other, and vice versa. A CMP process may then be performed to planarize the semiconductor device 200. In another embodiment, the first and second gate layers 262, 264 may further include a multilayer structure comprising multiple materials. The first and second gate layers 262, 264 may comprise liner layers, work function layers, fill layers, other suitable layers, and/or combinations thereof.

It is understood that the semiconductor device 200 may undergo further CMOS or MOS technology processing to form various features known in the art. Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

It is further understood that, in some embodiments, the formation of the hard mask layer 240 and/or the buffer layer 250 may be eliminated. For example, after formation of the gate structures 220, 230 over the substrate 210, an etch stop layer (e.g., ESL 252) is formed over the substrate 210, including over the gate structures 220, 230; and an ILD layer (e.g., ILD layer 254) is formed over the etch stop layer. Then, the method may continue by performing one or more etching processes (e.g., a first and second etching process) to expose a top portion of the gate structures 220, 230. The first and second etching processes comprise selective dry etching processes. For example, the first etching process may comprise an oxide etching process, wherein an oxide material is selectively etched, and the second etching process may comprise a nitride etching process, wherein a nitride material is selectively etched.

It is further understood that, in some embodiments, the method 100 is implemented for fabricating a semiconductor device in a gate first process or a hybrid gate process. In some embodiments, semiconductor devices fabricated in a gate first process may comprise one or more gate structures comprising a metal gate layer. In some embodiments, semiconductor devices fabricated in a gate first process may comprise one or more gate structures comprising a polysilicon layer. In some embodiments, the method 100 is implemented to form one or more contacts one or more gate structures.

In summary, a gate last process may be implemented to form an integrated circuit device having one or more gate structures. The disclosed method may be easily integrated into conventional integrated circuit processing, particularly in high-k/metal gate device fabrication. The disclosed embodiments may address problems arising from conventional fabrication of metal gate structures for NMOS and PMOS devices in a gate last process by reducing dishing and/or erosion effects arising from a chemical mechanical polishing process. Further, the disclosed embodiments may leave a hard mask layer disposed over the gate stacks of the one or more gate structures during the etch stop layer and ILD layer formation to better control gate height during the ILD layer chemical mechanical polishing process. It is understood that different embodiments may have different advantages, and that no particular advantage is necessarily required of all embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an semiconductor device, the method comprising:
   providing a substrate having one or more gate structures disposed thereover, the one or more gate structures each having a top surface;
   forming an etch stop layer and an interlevel dielectric (ILD) layer over the substrate, including over the respective top surfaces of the one or more gate structures, wherein the ILD layer is disposed over the etch stop layer;
   performing a partial chemical mechanical polishing process on the ILD layer, wherein a thickness of the ILD layer remains over the etch stop layer; and
   performing a first selective dry etching process on a portion of the ILD layer positioned above at least one of the top surfaces of the one or more gate structures and a second selective dry etching process on a portion of the etch stop layer positioned above the at least one of the top surfaces of the one or more gate structures.

2. The method of claim 1 wherein performing the first and second selective dry etching processes comprises utilizing selective dry etching processes having a high etching selectivity between the ILD layer and the etch stop layer.

3. The method of claim 2 wherein performing the first selective dry etching process comprises utilizing an oxide etching process and performing the second selective etching process comprises utilizing a nitride etching process.

4. The method of claim 2 wherein performing the first selective dry etching process comprises utilizing an oxide etching gas including $C_4F$, Ar, and CO.

5. The method of claim 2 wherein performing the second selective dry etching process comprises utilizing a nitride etching gas including Ar and $CF_4$.

6. The method of claim 1 wherein performing the first and second selective dry etching processes on the ILD layer and etch stop layer comprises exposing the top surface of the one or more gate structures.

7. The method of claim 6 wherein the ILD layer comprises silicon oxide, the etch stop layer comprises silicon nitride, and the one or more gate structures comprise polysilicon.

8. The method of claim 1 further comprising forming a buffer layer over the substrate, including over the one or more gate structures, prior to forming the etch stop layer and the ILD layer.

9. The method of claim 8 further comprising performing a third dry selective etching process on the buffer layer after performing the second dry selective etching process.

10. The method of claim 8 wherein the buffer layer comprises silicon oxide.

11. The method of claim 9 wherein performing the third selective dry etching process is substantially similar to performing the first selective dry etching process.

12. The method of claim 1 wherein the thickness of the ILD layer remaining over the etch stop layer ranges between about 200 Å and about 500 Å.

13. The method of claim 1 wherein performing the partial chemical mechanical polishing process on the ILD layer and performing the first and second selective dry etching processes occur in a gate last or a gate first process.

14. The method of claim 1 further comprising:
   removing a hard mask layer disposed over the one or more gate structures;
   removing a dummy gate layer from the one or more gate structures;
   replacing the removed dummy gate layer in at least one of the one or more gate structures with a first material having a first work function; and
   replacing the removed dummy gate layer in at least one of the one or more gate structures with a second material having a second work function different from the first work function.

15. A method for fabricating a semiconductor device, wherein the semiconductor device includes a substrate, the method comprising:
   forming one or more gate structures over the substrate including a high-k dielectric layer, a dummy gate layer, and a hard mask layer;
   forming an etch stop layer, and an interlevel dielectric (ILD) layer over the one or more gate structures;
   performing a partial chemical mechanical polishing process on the ILD layer, wherein a thickness of the ILD layer remains over the etch stop layer;
   performing a first selective dry etching process to selectively remove a portion of the ILD layer over the one or more gate structures;
   performing a second selective dry etching process to selectively remove a portion of the etch stop layer over the one or more gate structures; and
   performing a third selective dry etching process to selectively remove the hard mask layer.

16. The method of claim 15 further comprising:
   replacing the dummy gate layer of a first set of the one or more gate structures with a first gate layer having a first work function; and
   replacing the dummy gate layer of a second set of the one or more gate structures with a second gate layer having a second work function.

17. The method of claim 15 wherein performing the first selective dry etching process is substantially similar to performing the third selective dry etching process.

18. The method of claim 17 wherein performing the first and third selective dry etching processes comprises utilizing an oxide etching process.

19. The method of claim 15 wherein performing the second selective dry etching process comprises utilizing a nitride etching process.

20. A method for fabricating a semiconductor device, the method comprising:
   providing a substrate having at least one gate structure including a dummy gate layer disposed thereover;
   forming a buffer layer, an etch stop layer, and an interlevel (ILD) layer over the substrate, including over the at least one gate structure;
   performing a partial chemical mechanical polishing process on the ILD layer;
   performing at least two selective dry etching processes to remove the ILD layer, etch stop layer, and buffer layer from over the one or more gates structure; and
   removing the dummy gate layer from the at least one gate structure after performing the at least two selective dry etching processes.

21. The method of claim 20 wherein performing the at least two selective dry etching processes to remove the ILD layer, etch stop player, and buffer layer over the one or more gate structure comprises:
   performing a first oxide etching process on the ILD layer;
   performing a nitride etching process on the etch stop layer; and
   performing a second oxide etching process on the buffer layer.

* * * * *